United States Patent [19]
Murzin et al.

[11] Patent Number: 6,041,735
[45] Date of Patent: Mar. 28, 2000

[54] INDUCTIVELY COUPLED PLASMA POWDER VAPORIZATION FOR FABRICATING INTEGRATED CIRCUITS

[75] Inventors: Ivan Herman Murzin, Garland; Ram K. Ramamurthi, Allen, both of Tex.

[73] Assignee: Ball Semiconductor, Inc., Allen, Tex.

[21] Appl. No.: 09/033,180

[22] Filed: Mar. 2, 1998

[51] Int. Cl.[7] .................................................. C23C 16/00
[52] U.S. Cl. ...................................... 118/723 I; 118/715
[58] Field of Search ................................... 438/679, 680; 118/723 I, 723 R, 717, 716, 723 ER; 204/192

[56] References Cited

U.S. PATENT DOCUMENTS

| | | | |
|---|---|---|---|
| 3,840,750 | 10/1974 | Davis et al. | 204/192 |
| 4,268,711 | 5/1981 | Gurev | 204/192 |
| 4,786,477 | 11/1988 | Yoon et al. | 118/716 |
| 4,788,082 | 11/1988 | Schmitt . | |
| 5,178,743 | 1/1993 | Kumar . | |
| 5,630,880 | 5/1997 | Eastlund | 118/723 I |
| 5,772,771 | 6/1998 | Li et al. | 118/723 I |
| 5,792,272 | 8/1998 | Van Os et al. | 118/723 I |
| 5,811,022 | 9/1998 | Savas et al. | 118/723 I |
| 5,824,158 | 10/1998 | Takeuchi et al. | 118/723 I |
| 5,885,358 | 3/1999 | Maydan et al. | 118/723 I |

OTHER PUBLICATIONS

Wang, Ma, Golz, Halpern & Schmitt/High–Quality MNS Capacitors Prepared by Jet Vapor Deposition at Room Temperature/pp. 12–14.

Heberlein & Pfender/Thermal Plasma Chemical Vapor Deposition/ pp. 1–7, 1–15.

Kong & Pfender/Synthesis of Ceramic Powders in a Thermal DC Plasma Jet by Injection of Liquid Precursors/ pp. 2–8.

Akira Ishikawa/Spherical Shaped Semiconductor Integrated Circuit/ U.S. Serial No. 08/858,004/ Filed: May 16, 1997; Abstract and 15 sheets of drawings.

*Primary Examiner*—Shrive Beck
*Assistant Examiner*—Parviz Hassonzadeh
*Attorney, Agent, or Firm*—Haynes & Boone, L.L.P.

[57] ABSTRACT

An apparatus and method for performing material deposition on semiconductor devices. The apparatus provides an enclosure for defining a chamber. The chamber includes a metallic portion such as a conductor coil powered by a voltage generator. A gas, having a suspension of particles for treating the semiconductor devices, is introduced into the chamber and the powered conductor coil converts the gas to inductively coupled plasma and vaporizes the particles. The particles can then be deposited on the semiconductor devices.

13 Claims, 2 Drawing Sheets

INDUCTIVELY COUPLED PLASMA POWDER VAPORIZATION FOR FABRICATING INTEGRATED CIRCUITS

CROSS-REFERENCE TO RELATED APPLICATIONS

The present invention is a continuation-in-part of U.S. application Ser. No. 08/996,260 filed Dec. 22, 1997 and entitled Apparatus and Method for Fabricating Spherical Shaped Semiconductor Integrated Circuits, which is hereby incorporated by reference.

BACKGROUND OF THE INVENTION

The invention relates generally to semiconductor integrated circuits, and more particularly, to an apparatus and method for fabricating a spherical-shaped semiconductor integrated circuit.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

A fabrication facility is relatively expensive due to the enormous effort and expense required for creating flat silicon wafers and chips. For example, manufacturing the wafers requires several high-precision steps including creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above processes typically have many defects which are largely attributable to the difficulty in making a single, highly pure crystal due to the above cutting, grinding and cleaning processes as well as due to the impurities, including oxygen, associated with containers used in forming the crystals. These defects become more and more prevalent as the integrated circuits formed on these wafers become smaller.

Another major problem associated with modern fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, the peripheral portion of each wafer cannot be used.

Still another problem associated with modern fabrication facilities is that they do not produce chips that are ready to use. Instead, there are many additional steps that must be completed, including cutting and separating the chip from the wafer; assembling the chip to a lead frame which includes wire bonding, plastic or ceramic molding and cutting and forming the leads, positioning the assembled chip onto a printed circuit board; and mounting the assembled chip to the printed circuit board. The cutting and assembly steps introduce many errors and defects due to the precise requirements of such operations. In addition, the positioning and mounting steps are naturally two-dimensional in character, and therefore do not support curved or three dimensional areas.

Therefore, due to these and various other problems, only a few companies in the world today can successfully manufacture conventional flat chips. Furthermore, the chips must bear a high price to cover the costs of manufacturing, as well as the return on initial capital and investment.

In U.S. Pat. No. 5,995,776, assigned to the same assignee as the present application and hereby incorporated by reference, a method and apparatus for manufacturing spherical-shaped semiconductor integrated circuits is disclosed. The present invention is specific to an apparatus and method for performing metal deposition on the circuits.

SUMMARY OF THE INVENTION

The present invention, accordingly, provides an apparatus and method for performing material (e.g. metal) deposition on semiconductor devices. In one embodiment, the apparatus provides an enclosure for defining a chamber. The chamber includes a metallic portion such as a conductor coil powered by a voltage generator. A gas, having a suspension of particles for treating the semiconductor devices, is introduced into the chamber and the powered conductor coil converts the gas to inductively coupled plasma and vaporizes the particles. The particles can then be deposited on the semiconductor devices.

Several advantages result from the foregoing. For one, the semiconductor devices can be continuously introduced into the chamber to reduce or eliminate the need for a clean room environment. Also, the chamber can be maintained at a relatively high temperature above conventional semiconductor material warping or melting points. Further, the method of the present invention can be carried out in a relatively small space and eliminates the requirements for assembly and packaging facilities.

DESCRIPTION OF THE PREFERRED EMBODIMENT

Figure 1:
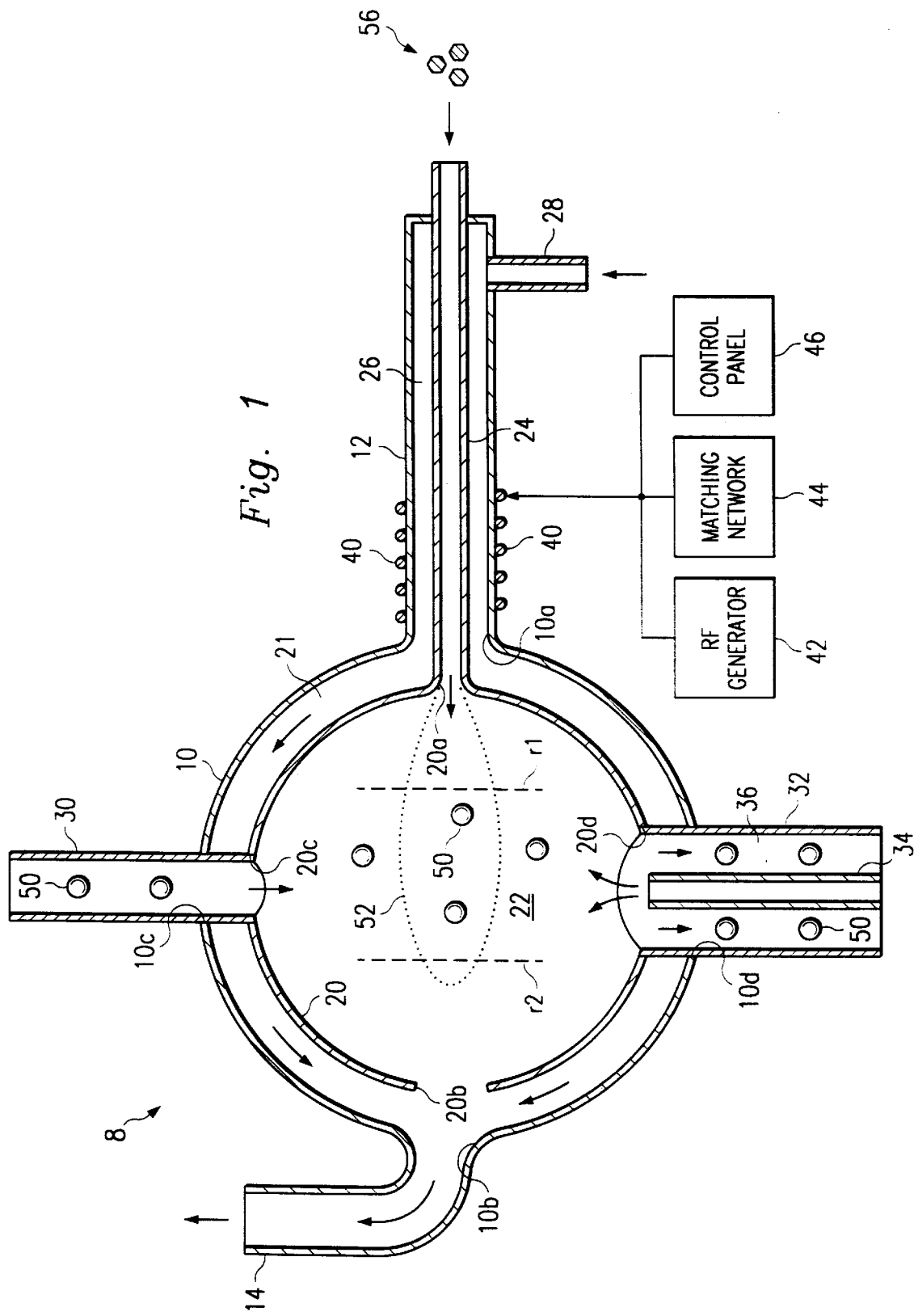
FIG. 1 is a cross-sectional view of the apparatus of the present invention.

Referring to FIG. 1, the reference numeral 8 refers, in general, to a processing device including a hollow outer sphere 10 having an inlet opening 10a and an outlet opening 10b located diametrically opposite the inlet opening 10a. One end of a horizontally extending inlet conduit 12 registers with the inlet opening 10a of the sphere 10, and one end of a generally U-shaped outlet conduit 14 registers with the outlet opening 10b. It is understood that the conduits 12 and 14 are connected to the sphere 10 in any known manner and, alternately, can be formed integrally with the sphere.

A hollow inner sphere 20 extends within the sphere 10 in a coaxial, slightly spaced relationship to define a substantially spherical passage 21 therebetween. The inner sphere 20 has an inlet opening 20a and an outlet opening 20b registering with a chamber 22 defined by the interior of the sphere, with the outlet opening 20b being located diametrically opposite the inlet opening 20a. One end of a horizontally extending inlet conduit 24 registers with the inlet opening 20a of the inner sphere 20, and is connected to the sphere 10 in any known manner. The inlet conduit 24 extends within the inlet conduit 12 in a spaced relation thereto to define, with the inlet conduit 12, a cylindrical inlet passage 26 that communicates with the passage 21. Although not shown in the drawings, it is understood that the conduit 24 is supported within the conduit 12 in any known manner such as by struts, or the like. A nipple 28, or the like, is connected to the distal end portion of the inlet conduit 12 to introduce a first fluid into the passage 26, and the distal end of the inlet conduit 24 is open so as to provide an inlet to receive one or more additional fluids. For example, the first fluid introduced into the passage 26 via the nipple 28 could be a cooling fluid and the fluids introduced into the inlet conduit 24 could be a plasma gas and a process gas which function in a manner to be described.

A second inlet opening 20c and a second outlet opening 20d are formed through the inner sphere 20. The openings 20c and 20d are diametrically opposed and extend in a ninety degree, angularly spaced, relation to the openings 20a and 20b. A pair of diametrically opposed openings 10c and 10d are formed through the outer sphere 10 and are aligned with the openings 20c and 20d, respectively, of the inner sphere 20.

A vertically extending inlet conduit 30 extends through the opening 10c in the outer sphere 10 and registers with the opening 20c of the inner sphere 20. A vertically extending outlet conduit 32 extends through the opening 10d in the outer sphere 10 and registers with the opening 20d in the inner sphere 20. A conduit 34 extends within the outlet conduit 32, through the opening 10d in the outer sphere, and also registers with the opening 20d of the inner sphere 20. The diameter of the conduit 34 is less than that of the outlet conduit 32 so as to form a cylindrical passage 36 which also registers with the opening 20d of the inner sphere 20. Although not shown in the drawings, it is understood that the conduit 34 is supported within the conduit 32 in any known manner such as by struts, or the like.

An electrical conductor 40 is coiled around the outer surface of the conduit 12 The conductor 40 is connected to a radio frequency (RF) power generator 42, an impedance matching network 44, and a control panel 46 for creating a radio frequency signal in connection with a plasma process that may be performed in connection with the chamber 22 as described below. The RF generator 42, matching network 44, and control panel 46 are conventional devices for producing plasma torches.

In operation, a plurality of members 50, each of a semiconductor material, are introduced into the inlet conduit 30 and pass into the chamber 22 in the inner sphere 20. The members 50 are preferably of a generally spherical shape and could be of the same type formed according to the technique disclosed in the above-identified and presently incorporated U.S. Pat. No. 5,995,776. After traversing the interior of the chamber 22, the members 50 pass through the outlet opening 20d in the inner sphere 20 before discharging from the chamber 22 through the conduit 32. The introduction and discharge of the members 50 in this manner is controlled to prevent the accumulation of a relatively large number of members in the chamber 22 at the same time. To this end, a fluid, such as an inert carrier gas, is introduced into the conduit 34 and therefore passes upwardly, as viewed in the drawing, into the chamber 22, with the velocity of the gas being controlled so that the discharge of the members 50 through the conduit 32 is controlled.

During this flow of the members 50 through the chamber, one or more gases are selectively introduced into the inlet end of the inlet conduit 24 and thus flow directly into the chamber 22. The particular gases that are introduced into the chamber depends on the specific desired treatment of the members 50. As an example, a high-purity argon gas is introduced into the conduit 24 and passes into and through the chamber 22 in a direction that extends approximately ninety degrees to the direction of the passage of the members 50 through the chamber. This gas (hereinafter referred to as a "plasma gas") establishes a toroidal plasma torch region 52, shown enclosed by the phantom lines in the drawing, through which the members 50 pass. The plasma gas therefore passes over the members 50 in the chamber and comes into intimate contact with the members. The velocity and mass flow of the plasma gas introduced into the chamber 22 in this manner is controlled so that the plasma gas passes through the chamber, exits the chamber through the outlet opening 20b in the inner sphere 20, and passes into the conduit 14 for discharge. The conduit 14 also asserts a negative pressure, thereby reducing the atmospheric pressure inside the chamber 22.

During the passage of the plasma gas through the chamber 22, the RF coil 40 is activated and the plasma gas, in combination with RF current from the coil, becomes an inductively coupled plasma. As a result, relatively high energy is created and applied to the region 52 in the chamber 22. Since this formation of an inductively coupled plasma, and the resultant creation of relatively high energy is well known in the art it will not be described in any further detail.

A suspension of fine powder particles 56 is also selectively introduced into the inlet end of the inlet conduit 24 and thus flows directly into the chamber 22. The plasma gas is used to suspend the particles 56 and inject the particles into a central portion of the region 52. The particles 56 can be metals, such as Al, Cu, W, or Ti. Alternatively, the particles 56 may be alumina, silica, nitrides, or a mixture of materials (e.g., a mechanical alloy). As a result, the processing device 8 may be the sole tool used to coat semiconductor spherical integrated circuits. The size of the particles 56 are in the micron to submicron range so that they can fully melt and subsequently vaporize in the inductively coupled plasma. The purity of the initial powder is essential for forming the resulting thin films of extra high purity.

Alternatively, a metal organic compound (e.g., Al containing metal organics such as trimethyl-aluminum, dimethyl-aluminum-hydride, or tri-isobutyl-aluminum) can be introduced into the plasma gas. Further, a mixture of metal organics and an inert gas (e.g., Ar or $N_2$) can be used to facilitate formation of inductively coupled plasma. The metal organics are injected in a controlled portion of region 52 and the inductively coupled plasma is formed therein. As a result of the metal organic dissolution, a thin layer of metal (e.g., Al) material is formed on the surface of the members 50. This layer can be used as a contact layer as described below.

Figure 2:
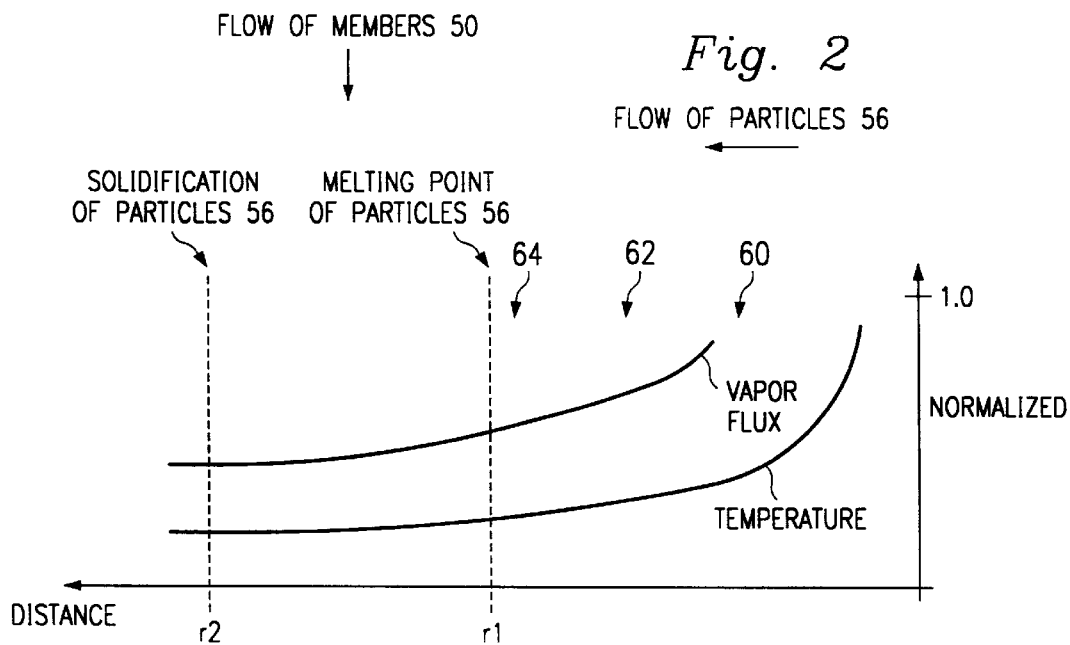
FIG. 2 is a graph of temperature and vapor flux vs. location for defining a deposition area in the apparatus of FIG. 1.

Referring also to FIG. 2, a central portion of the region 52 (graphically represented as the area between boundaries r1 and r2 and hereinafter designated deposition area r1-r2) has less density of plasma as opposed to the outer regions of the toroidal plasma, discussed in greater detail below. The boundary r1 of the deposition area r1-r2 is defined as the location in which the vapor flux of the particles 56 starts solidifying, while sufficient flux of the vapor still exists. The boundary r2 is defined as the location in which the temperature in the chamber is less than the melting point of silicon so as not to melt the members 50.

The particles 56 injected to the plasma region become vaporized by high temperatures existing within the region 52. The temperature range within the thermal atmospheric inductively coupled plasma may vary from about 5,000K to above 15,000K, depending on the power and frequency supplied by the RF generator 42. In the preferred embodiment, the RF generator 42 produces a maximum RF power of 2 kW and a working frequency of 13.56 MHz. It is understood, however, that other RF powers and frequencies may also be used.

Figure 3:
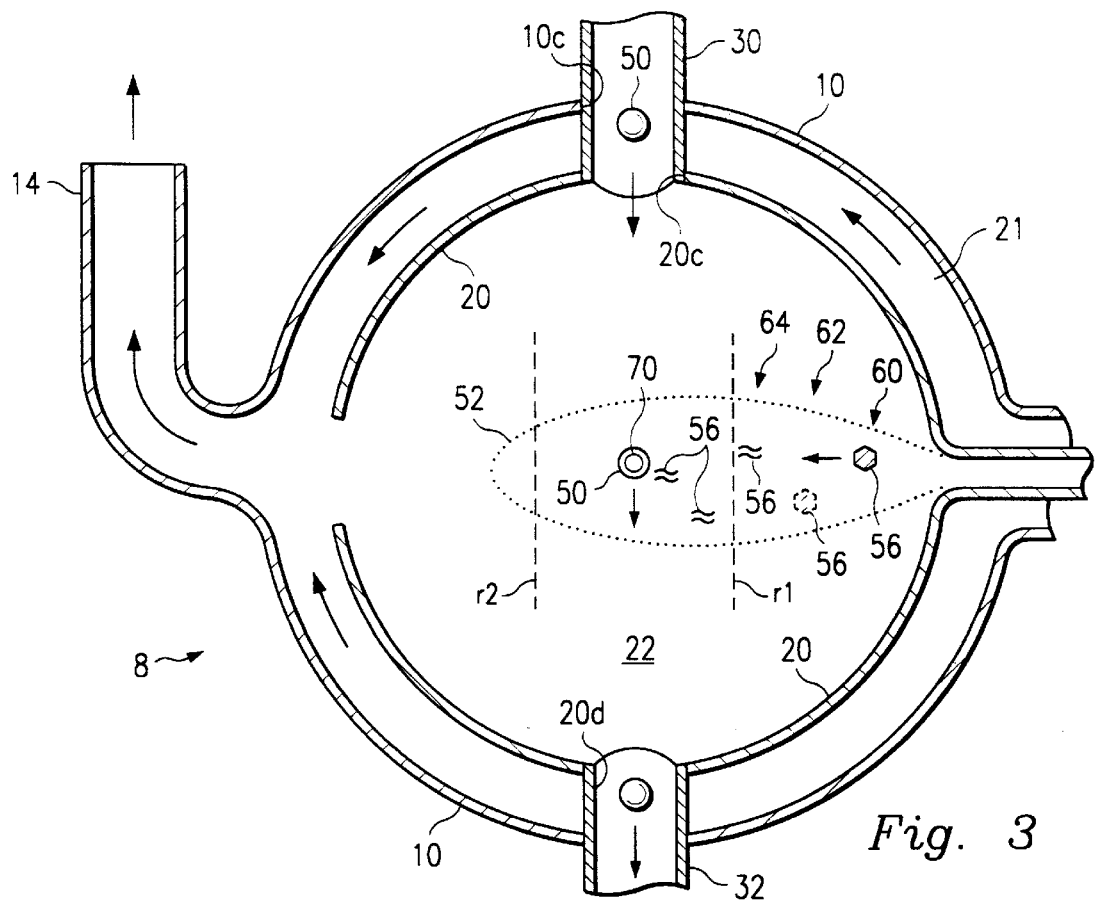
FIG. 3 is an expanded, sectional view of the apparatus of FIG. 1.

Referring to FIG. 3, the particles 56 passing through the region 52 start melting 60 and subsequently vaporize 62. The resultant vapor travels further through the region 52 into the deposition area r1-r2. The members 50 also pass through the deposition area r1-r2 for a duration long enough for depositing a thin film 70. The rate at which the members 50 travel can be adjusted by the flow of gas through the conduit 34, described in greater detail above. Also, the members 50 spin to facilitate uniform film coverage. One example of a thin film that can be made by the described technique is a thin metal (e.g., Ti) contact layer for use in a contact stack such as Ti/TiN/Al.

The apparatus and method of the present invention leads to several advantages. For one, the continuous flow of the members 50 through the chamber 22 reduces or eliminates the need for batch processing. Also, the chamber can be selectively maintained at a relatively high temperature at or above the warping or melting temperature of the members 50, by controlling the amount of inductively coupled plasma gas formed in the chambers. Further, the spherical shape of the members 50 provide much greater surface area on which the process gas acts, when compared to the surface area of a conventional flat semiconductor. Also, the method of the present invention can be carried out in a relatively small space and eliminates the requirements for large facilities.

It is understood that several variations may be made in the foregoing. For example, several separate inductively coupled plasma torches can be installed to increase the process throughput. Also the members 50 may have the thermal silicon oxide or other elements of an integrated circuit already formed thereon. Other modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An apparatus for performing material deposition on semiconductor devices, the apparatus comprising:

an enclosure defining a chamber, the enclosure containing a plurality of apertures and a metallic portion;

a voltage generator electrically connected to the metallic portion;

a first inlet registering with the chamber for receiving a plurality of semiconductor devices;

a second inlet registering with the chamber for receiving at least one gas for treating the semiconductor devices, the gas including a suspension of particles; and a first outlet registering with the chamber for receiving and discharging the semiconductor devices from the chamber;

wherein the voltage generator supplies a bias to the metallic portion, thereby converting the gas to an inductively coupled plasma and vaporizing the particles, and wherein the semiconductor devices are deposited with the vaporized particles as the semiconductor devices move from the first inlet to the first outlet.

2. The apparatus of claim 1 further comprising a second outlet registering with the chamber for receiving and discharging the gas from the chamber.

3. The apparatus of claim 2 further comprising a pressure means for altering the pressure inside the chamber.

4. The apparatus of claim 1 wherein the inductively coupled plasma forms a plasma torch inside the chamber and the semiconductor devices pass through a predefined portion of the plasma torch.

5. The apparatus of claim 4 wherein the predefined area of plasma torch has a temperature below a melting point of the semiconductor material and a vapor flux above a solidification point of the particles.

6. The apparatus of claim 2 wherein the first outlet is diametrically opposed to the first inlet and wherein the second outlet is diametrically opposed to the second inlet.

7. The apparatus of claim 1 further comprising:

a third inlet registering with the chamber for receiving a second gas for treating the semiconductor devices, the second gas also including a suspension of particles.

8. The apparatus of claim 1 wherein the particles are one of either aluminum, copper, tungsten, or titanium.

9. The apparatus of claim 1 wherein the particles are one of either alumina, silica, or nitride.

10. The apparatus of claim 1 wherein the particles are an alloy.

11. The apparatus of claim 1 wherein the semiconductor devices move from the first inlet to the first outlet without contacting each other.

12. The apparatus of claim 1 wherein the semiconductor devices move from the first inlet to the first outlet without contacting the enclosure.

13. The apparatus of claim 1 wherein the semiconductor devices are substantially spherical in shape and wherein an entire outer surface of each semiconductor device is deposited with the particles.

* * * * *